(12) United States Patent
Lee et al.

(10) Patent No.: US 7,531,881 B2
(45) Date of Patent: May 12, 2009

(54) SEMICONDUCTOR DEVICES HAVING TRANSISTORS WITH DIFFERENT GATE STRUCTURES AND METHODS OF FABRICATING THE SAME

(75) Inventors: Hye-Lan Lee, Gyeonggi-do (KR); Yu-Gyun Shin, Gyeonggi-do (KR); Sang-Bom Kang, Seoul (KR); Hag-Ju Cho, Gyeonggi-do (KR); Seong-Geon Park, Gyeonggi-do (KR); Taek-Soo Jeon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 11/400,560

(22) Filed: Apr. 7, 2006

(65) Prior Publication Data

US 2006/0273344 A1    Dec. 7, 2006

(30) Foreign Application Priority Data

Apr. 7, 2005    (KR) ...................... 10-2005-0029068

(51) Int. Cl.
 *H01L 29/76* (2006.01)
(52) U.S. Cl. .................. 257/369; 257/407; 257/412; 257/E29.226; 257/E27.064; 257/E21.637
(58) Field of Classification Search .............. 257/369, 257/E29.226
See application file for complete search history.

(56) References Cited

U.S. PATENT DOCUMENTS

| 6,468,851 | B1 * | 10/2002 | Ang et al. .................. 438/216 |
| 2001/0025973 | A1 * | 10/2001 | Yamada et al. ............... 257/296 |
| 2003/0080387 | A1 * | 5/2003 | Cho et al. .................... 257/369 |
| 2004/0171222 | A1 | 9/2004 | Gao et al. .................... 438/283 |
| 2005/0070062 | A1 * | 3/2005 | Visokay et al. ............... 438/236 |
| 2005/0167762 | A1 * | 8/2005 | Kadoshima et al. ......... 257/392 |
| 2005/0287759 | A1 * | 12/2005 | Wang et al. .................. 438/400 |

FOREIGN PATENT DOCUMENTS

| KR | 10-2001-0110769 A | 12/2001 |
| KR | 1020020013072 A | 2/2002 |
| KR | 2003-37346 A | 5/2003 |
| KR | 2004-4657 | 1/2004 |
| KR | 1020040034087 A | 4/2004 |
| KR | 10-2005-0045737 A | 5/2005 |
| WO | WO 2004/082005 A1 | 9/2004 |

OTHER PUBLICATIONS

Korean Intellectual Property Office Notice to Submit Response for Application No. 10-2005-0029068; date of mailing Aug. 23, 2006.

* cited by examiner

*Primary Examiner*—Tu-Tu V Ho
(74) *Attorney, Agent, or Firm*—Myers Bigel Sibley & Sajovec, P.A.

(57) ABSTRACT

A semiconductor device has two transistors of different structure from each other. One of transistors is P-type and the other is N-type. One of the transistors includes a gate structure in which a polysilicon layer contacts a gate insulation film while the other transistor includes a gate structure in which a metal layer contacts a gate insulation film.

14 Claims, 15 Drawing Sheets

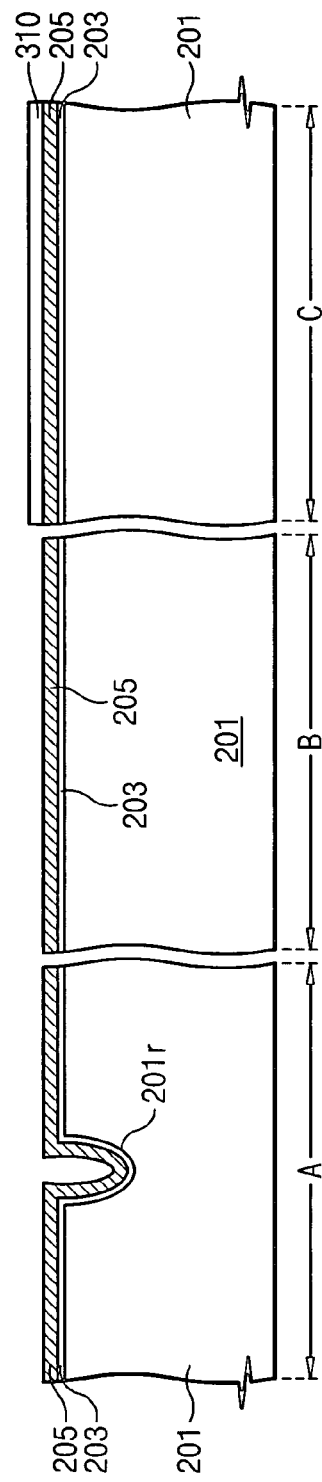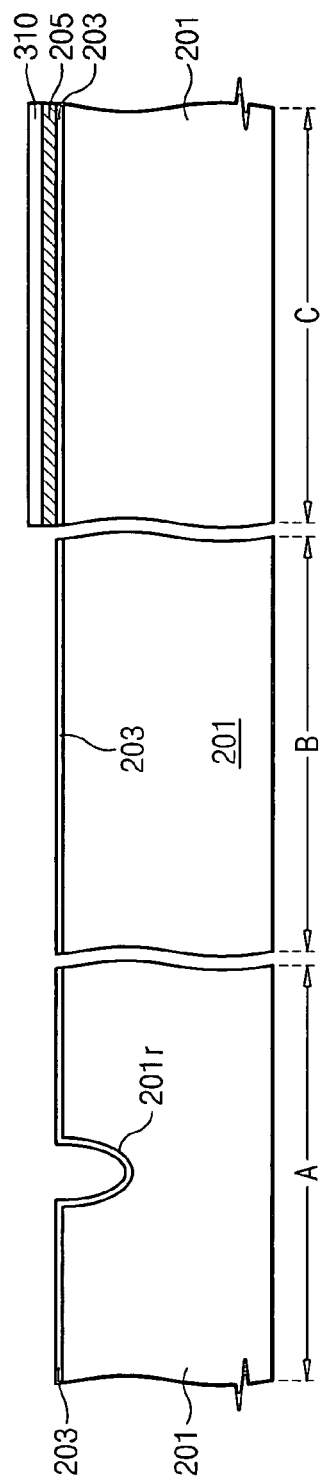

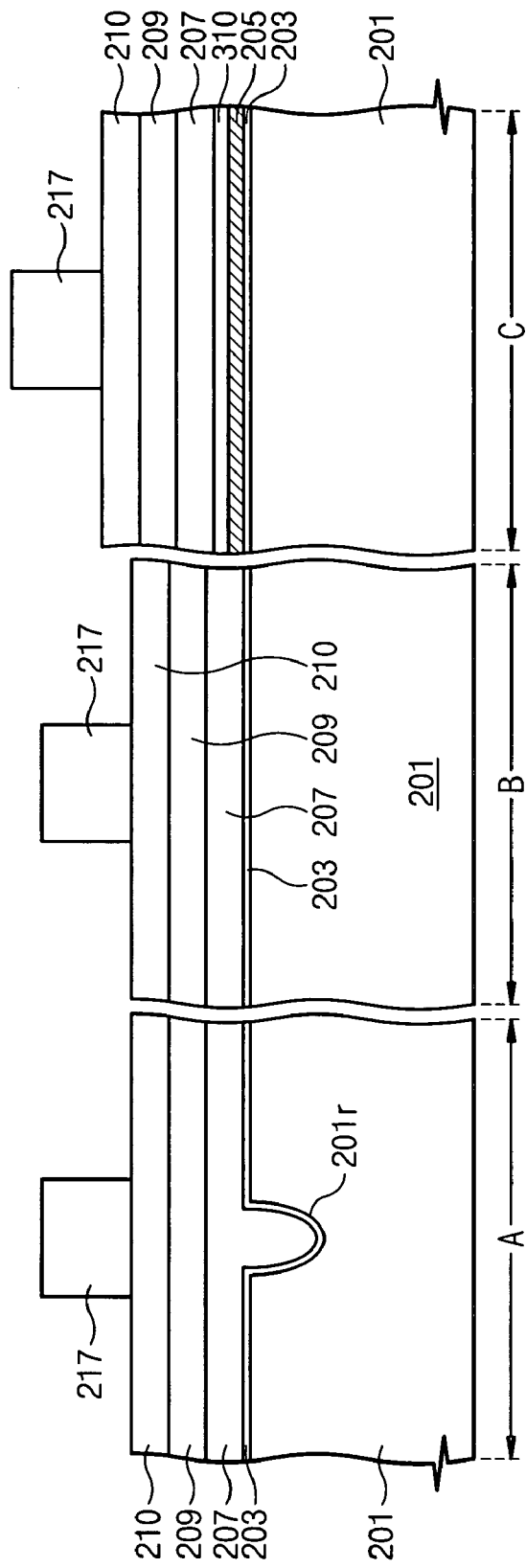

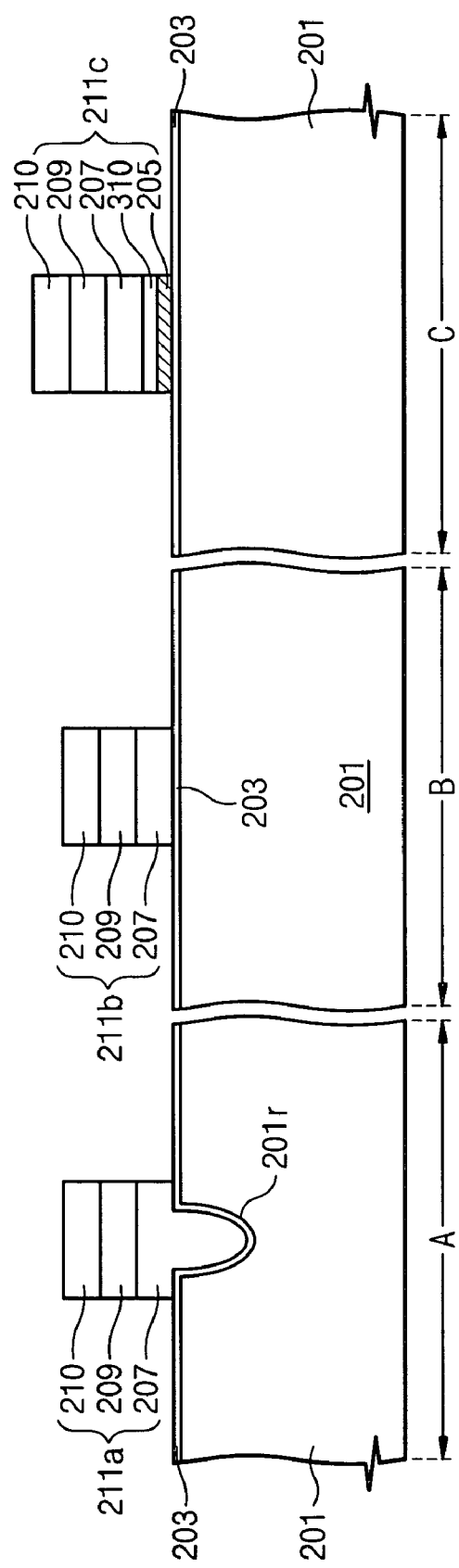

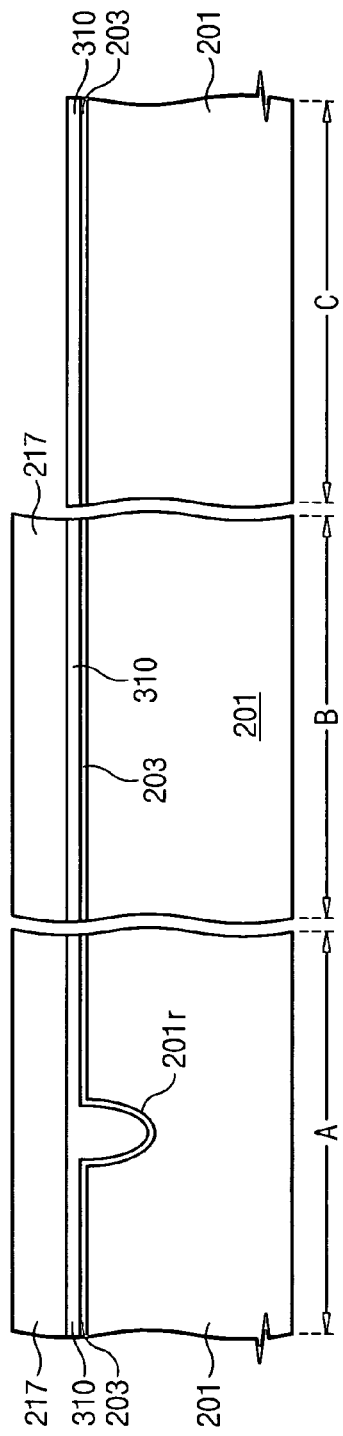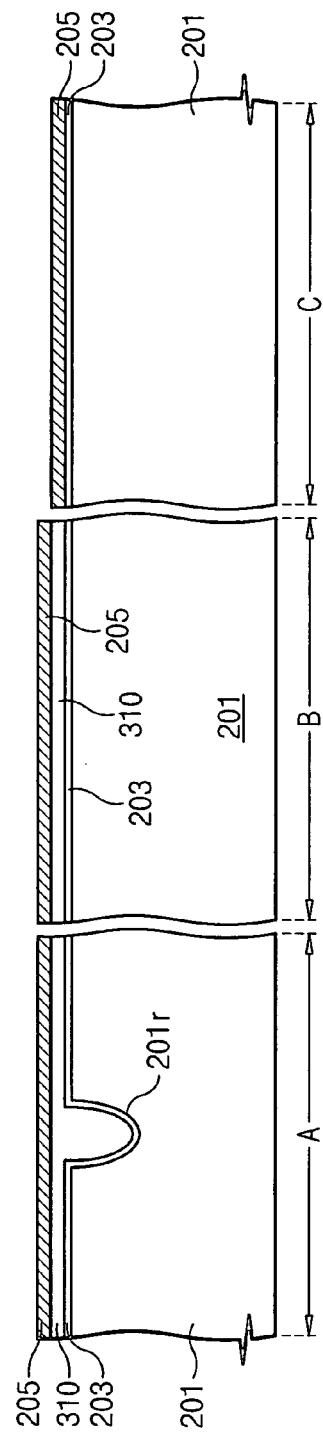

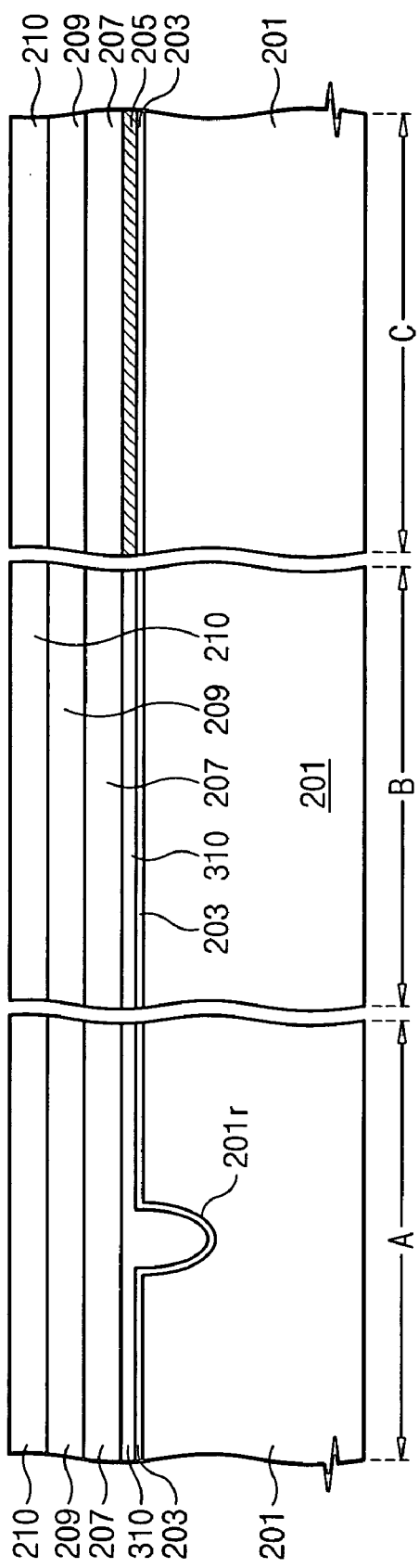

SEMICONDUCTOR DEVICES HAVING TRANSISTORS WITH DIFFERENT GATE STRUCTURES AND METHODS OF FABRICATING THE SAME

CROSS-REFERENCE TO RELATED APPLICATIONS

This U.S. non-provisional patent application claims priority under 35 U.S.C. § 119 of Korean Patent Application 2005-29068 filed on Apr. 7, 2005, the entire contents of which are hereby incorporated by reference.

BACKGROUND

The present invention relates to semiconductor devices, and, more particularly, to gate structures of region effect transistors and methods of fabricating the same.

Integrated circuit devices based on silicon processing technologies, specifically, metal-oxide-semiconductor (MOS) devices, e.g., region effect transistors (FETs or MOSFETs), have been fabricated with the aim of improving speeds, integration density, and operational function while reducing the cost of products as well. A typical MOS transistor is formed with the source and drain being spaced apart from each other by a channel region in a substrate. The electrical potential of the channel region is controlled by a gate that is electrically isolated from the channel region by a gate insulation film.

Typically, a process for formation of a transistor includes ion implantation, thermal oxidation, film deposition, photolithography, and/or etching. The ion implantation (or injection) process is carried out to form source and drain regions, and to adjust a threshold voltage of the transistor. The film deposition process is used to deposit a conductive material for a gate electrode or to deposit an insulation film for a gate insulation film. The thermal oxidation process may be used to deposit a gate insulation film instead of the film deposition process. The lithography and etching processes are conducted to form a deposited conductive film into a required gate pattern in general.

While such various manufacturing processes may affect characteristics of the transistors, e.g., threshold voltages, the processes of forming the gate insulation and conductive films may heavily influence the threshold voltages of the transistors. The threshold voltage of a transistor may be greatly affected by the materials used for the gate insulation and conductive films. However, the materials for the gate insulation and conductive films are typically limited to those that are suitable for integration throughout semiconductor fabrication process.

The gate insulation film is typically formed of silicon oxide while the gate conductive film is typically formed of polycrystalline silicon. The silicone oxide film can provide an excellent interface characteristic with a semiconductor substrate, such as a silicon substrate. The polycrystalline silicon may also provide an excellent interface characteristic with the silicon oxide film. Thus, the silicon oxide film may be used for the gate insulation film and the polycrystalline silicon may be used for the gate conductive material.

Recently, there have been demands for higher integration density in view of high performance, high speed, low power consumption, and economy. Therefore, to fulfill such demands for higher integration density, it may be necessary to substitute a new material for a conventional silicon oxide film that has been used as the gate insulation film of the transistor.

An insulation film with a high dielectric constant may be substituted for a silicon oxide film that has been conventionally used as the gate insulation film. For high integration of the transistor, a silicon oxide gate insulation film may be formed with a small thickness. But the thin gate insulation film may cause an increase of leakage current even if it contributes to the high integration of the transistor. For instance, electrons may tunnel through such a thin silicon oxide film to increase a leakage current therein when the gate is being supplied with a voltage over its threshold voltage. For those reasons, there have been many studies conducted for advantageously using an insulation material other than silicon oxide that has a higher dielectric constant than silicon oxide. A high-dielectric insulation material is advantageous to reducing a leakage current because its physical film thickness is much larger than that of the silicon oxide film in the range of the equivalent oxide thickness (EOT) characteristic overcoming the problems involved in the thin silicon oxide film. Recently, hafnium oxide ($HfO_2$) has been used as the high-dielectric insulation material for the gate insulation film.

However, a high-dielectric insulation film, such as a hafnium oxide film, may be insufficient to retain an excellent interface characteristic between a gate electrode and a silicon substrate. While forming the hafnium oxide film on the silicon substrate, hafnium atoms may react with silicon atoms and thereby a Fermi level may be pinned around a conduction band of the silicon. The gate electrode formed of a polysilicon induces so-called 'gate depletion'. Those effects of gate depletion and Fermi level pinning around the conduction band of the silicon act as factors that may increase threshold voltages of transistors.

Meanwhile, in a P-type transistor (PMOS), a polycrystalline silicon gate is doped with P-type dopant, such as boron, to adjust its threshold voltage. But the highly doped boron may cause so-called 'boron penetration' in which boron atoms penetrate into the silicon substrate through the gate insulation film. Further, the P-type transistor may also be affected by gate depletion, which may increase its threshold voltage.

SUMMARY OF THE INVENTION

Some embodiments of the present invention provide a semiconductor device having two transistors of different structure from each other. One of the transistors is P-type and the other is N-type. One of the transistors includes a gate structure in which a polysilicon layer contacts a gate insulation film, while the other transistor includes a gate structure in which a metal layer contacts a gate insulation film.

In other embodiments, when a Fermi level is pinned around a conduction band of the polysilicon layer, the metal layer is used as the gate of the P-type transistor while the polysilicon layer is used as the gate of the N-type transistor.

In still other embodiments, the semiconductor device comprises a first N-type transistor formed in a first region of a substrate; and a second N-type transistor and a P-type transistor in a second region of the substrate. The first region may be a cell region and the second region may be a peripheral region. Gates of the first and second N-type transistors and the gate of the P-type transistor are isolated from the substrate through gate insulation films. The gates of the first and second N-type transistors each include polysilicon layers that contact the gate insulation films. The gate of the P-type transistor includes a metal layer that contacts the gate insulation film.

In the first N-type transistor in the first region and the second N-type transistor in the second region, the polysilicon layer is in direct contact with the gate insulation films. For example, in both of the N-type transistors of the memory cell and peripheral circuit regions, the polysilicon layer is used as the gates thereof and directly contacts the gate insulation film. In this case, the Fermi level is pinned around the conduction band of the polysilicon. It may be possible to compensate for an increased threshold voltage by adjusting the dopant concentration. Therefore, although the polysilicon gate is used for the N-type transistor, it is possible to set an optimum threshold voltage that is required of the N-type transistor.

Meanwhile, in the P-type transistor, as the threshold voltage increases, it may be difficult to compensate for the threshold voltage elevation by adjusting the dopant concentration. Thus, some embodiments of the invention use a metal layer for the gate of the P-type transistor. Because the gate insulation film directly contacts the metal layer in the P-type transistor, it may not generate the problems of boron penetration and gate depletion as compared to the case where a polysilicon gate contacts a gate insulation film in a conventional P-type transistor. And, as a metal with an appropriate work function is used as the gate material, it may be able to regulate a threshold voltage of the P-type transistor.

Although the option of using a metal layer as the gates of the N-type transistors may be considered, it may be difficult in practice because it may be hard to find a metal having a work function adaptable both to the N-type and P-type transistors.

Using the polysilicon gate for the N-type transistor in the memory cell region may be advantageous in manufacturing. To lessen a short channel effect, some embodiments of the invention provide a fin region-effect transistor and a recessed-channel transistor. Because the polysilicon layer has generally excellent step coverage, it may be deposited on a substrate having an uneven surface caused by a fin structure or recess structure.

The gate insulation film may be formed of a high-dielectric material such as silicate, oxy-nitride, binary oxide, or ternary oxide. For example, the gate insulation film may comprise $HfO_2$, $ZrO_2$, $TiO_2$, $Al_2O_3$, $Ta_2O_5$, $Nb_2O_3$, $La_2O_3$, $Pr_2O_3$, $Ce_2O_3$, $Dy_2O_3$, $Er_2O_3$, $Y_2O_3$ and $ZrSiO_4$, ZrSiON, HfSiO, HfSiON, HfAlO, HfAlON, AlSiO, AlSiON, $BaSiO_4$, $PbSiO_4$, BST, PZT, or a combination thereof and is not limited thereto.

The metal layer for the gate of the P-type transistor may comprise Ta, Ti, Al, Ag, Cu, Hf, Zr, Mn, Ni, Pd, Pt, Be, Ir, Te, Re, Ru, $RuO_2$, TiN, TaN, WN, HfN, HfN, ZrN, TaSiN, TaSiN, NiSi, metal silicide, or a combination thereof, and is not limited thereto.

The metal layer of the P-type transistor may be formed with a relatively small thickness in consideration of manufacturing processes because there are some difficulties in etching the metal layer. Therefore, to minimize or reduce the height difference in the gate between the P-type and N-type transistors in the peripheral region, the polysilicon layer for the N-type transistor may be formed on the metal gate of P-type transistor in the peripheral region.

For lessening RC signal delay, the gate may be formed to have relatively low resistance. Thus, the gates of the transistors may include low-resistive metals. For example, the gate of the N-type transistor may be formed of a polysilicon layer and a low-resistive metal layer that are stacked in sequence on the gate insulating film. The gate of the P-type transistor may be formed of a metal layer, a polysilicon layer, and a low resistive metal layer that are stacked in sequence on the gate insulating film. In this case, the low-resistive metal layer may be made of tungsten, tungsten nitride, tungsten silicide, or a combination thereof.

The gate of the N-type transistor may be formed of a metal layer while the gate of the P-type transistor may be formed of a P-type doped polysilicon layer when the Fermi level is pinned around a valence band of the polysilicon layer due to contact between the high-dielectric insulation film and the polysilicon layer.

Some embodiments of the present invention may provide a method of fabricating a semiconductor device, comprising: forming a gate insulation film on a substrate including a memory cell region and peripheral circuit region; selectively forming a first metal layer on the gate insulation film in a second-conductivity transistor region of the peripheral circuit region; forming a doped silicon layer on the gate insulation film in a first-conductivity transistor region of the peripheral region, on the gate insulating film in the memory cell region, and on the first metal layer; and patterning the first metal layer and the doped silicon layer to form a first gate structure made of the doped silicon layer in the memory cell region and in the first-conductivity transistor region of the peripheral circuit region and to form a second gate structure made of the first metal layer and the doped silicon layer in the second-conductivity transistor region of the peripheral circuit region.

Some embodiments of the present invention provide a method of fabricating a semiconductor device, comprising: forming a gate insulation film on a substrate including a memory cell region and a peripheral circuit region; forming a first doped silicon layer on the gate insulation film in the memory cell region and a first-conductivity transistor region of the peripheral circuit region; forming a first metal layer on the gate insulation film in a second-conductivity transistor of the peripheral circuit region; forming a second doped silicon layer on the first doped silicon layer and the first metal layer; and patterning the first metal layer, and the first and second doped silicon layers to form a first gate structure made of the first and second doped silicon layers in the memory cell region and the first-conductivity transistor region of the peripheral circuit region and to form a second gate structure made of the first metal layer and the second doped silicon layer in the second-conductivity transistor region of the peripheral circuit region.

BRIEF DESCRIPTION OF THE FIGURES

The accompanying drawings are included to provide a further understanding of the invention, and are incorporated in and constitute a part of this specification. The drawings illustrate example embodiments of the invention and, together with the description, serve to explain principles of the present invention. In the drawings:

FIGS. 6 through 10 are cross-sectional diagrams illustrating methods for fabricating a semiconductor device in accordance with some embodiments of the invention;

FIGS. 15 through 18 are cross-sectional diagrams illustrating processing operations for fabricating a semiconductor device in accordance with still further embodiments of the invention.

DETAILED DESCRIPTION OF EMBODIMENTS

Figure 1:
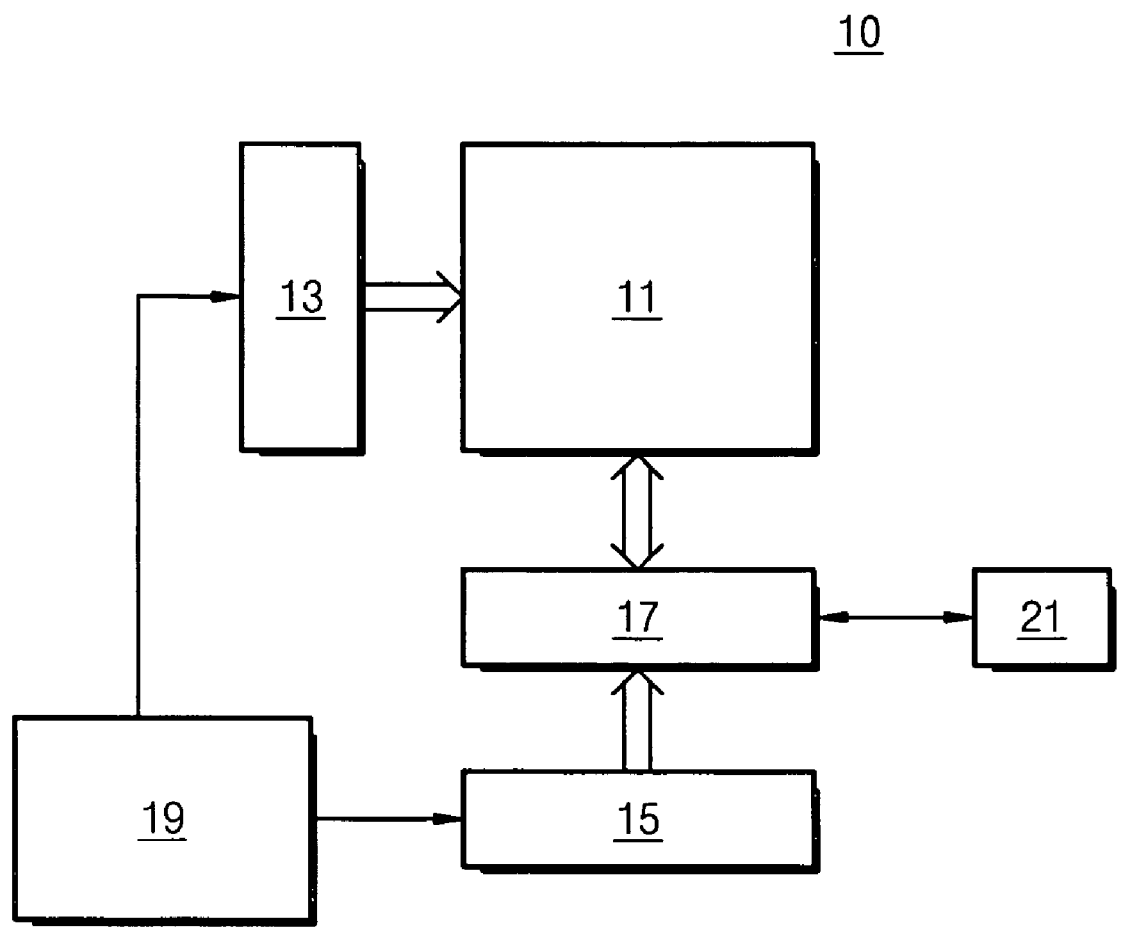
FIG. 1 is a schematic that illustrates a memory device to which a transistor according to some embodiments of the invention may be applicable.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

Embodiments of the invention relate to semiconductor devices, and, more specifically, to gate structures of a transistor. Therefore, general structural features or processing methods well known in semiconductor technology will be briefly discussed herein or not discussed at all.

A transistor according to some embodiments of the invention is one of the components constituting a semiconductor integrated circuit, which may be used in an analog circuit, a logical circuit such as a digital circuit, or a memory cell of a semiconductor memory device.

FIG. 1 schematically illustrates a semiconductor memory device 10 in which a transistor according to some embodiments of the present invention may be used. The memory device 10 includes a memory cell region 11 where a plurality of memory cells are arranged, row and column decoders 13 and 15 for selecting a specific memory cell in the memory cell region, a sense amplifier 17 for detecting information stored in the selected memory cell, an input/output circuit 21 for outputting the information detected by the sense amplifier 17, and a controller 19 for controlling the row and column decoders 13 and 15. The area except the memory cell region 11 is typically called a peripheral circuit region.

The transistor according to some embodiments of the invention may be used in all of the components of the aforementioned memory device 10. For instance, a gate of the transistor according to some embodiments of the invention may function as a wordline to select a specific memory cell in the memory cell region 11. Or, the transistor according to some embodiments of the invention may be used as a memory cell. That use of the transistor, according to some embodiments of the invention, will be discussed with reference to FIGS. 2A through 2D hereinafter. FIGS. 2A through 2D are equivalent circuit diagrams illustrating various unit memory cells constituting the memory cell region 10 of the memory device shown in FIG. 1.

Figure 2A:
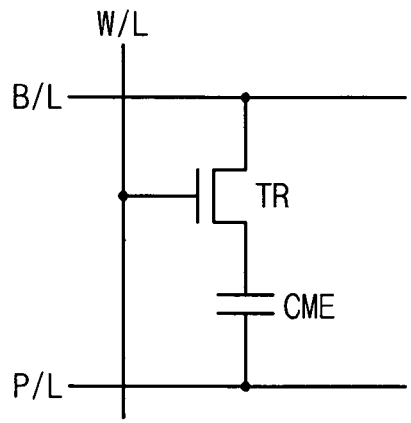
FIGS. 2A through 2D are equivalent circuit diagrams illustrating various unit memory cells constituting a memory cell region of the memory device shown in FIG. 1.

Referring to FIG. 2A, a unit memory cell includes a single transistor TR and a single capacitor CME, which corresponds to a DRAM cell. One of two detectable states is alternatively determined in accordance with presence or absence of charges stored in the capacitor CME. The gate of the transistor TR in the memory cell acts as a wordline W/L. The drain of the transistor TR is connected to an electrode of the capacitor CME while the source of the transistor TR is connected to a bitline B/L. The other electrode of the capacitor CME is connected to a plate line P/L.

Figure 2B:
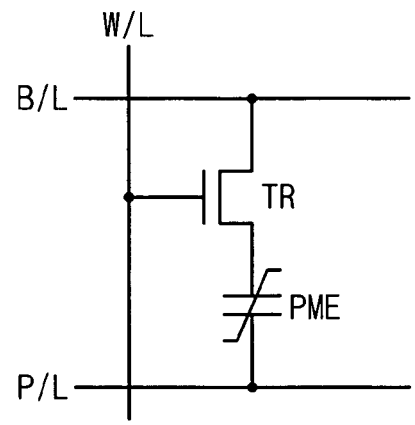

The unit memory cell shown in FIG. 2B is provided for a ferroelectric memory device, basically having the same architecture as the DRAM cell of FIG. 2A. But, different from the DRAM cell of FIG. 2A, the memory cell of FIG. 2B uses a capacitive memory element PME made of a ferroelectric material that is able to retain the characteristic of dielectric polarization even without a power supply. Such a ferroelectric memory device exhibits a nonvolatile characteristic.

Figure 2C:
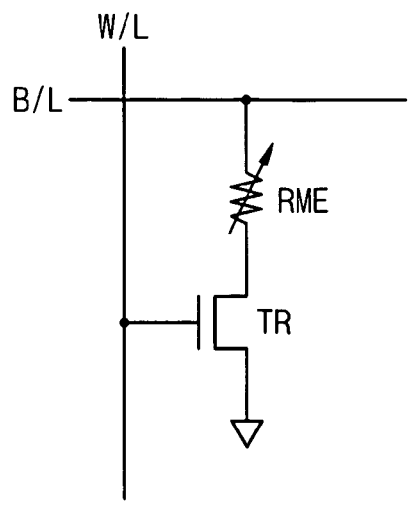

FIG. 2C shows an equivalent circuit of a unit memory cell for a resistive RAM (RRAM). The unit memory cell of the resistive RAM includes a single transistor TR and a single resistive element RME. A terminal of the resistive memory element RME is connected to a bitline B/L while the other terminal of the resistive memory element RME is connected to the drain of the transistor TR. The source of the transistor TR is grounded and its gate functions as a wordline W/L. The resistive memory element RME is formed of a material capable of being switched alternatively into two resistive states by an electric signal applied thereto. The resistive memory element RME may include phase-changeable materials, such as chalcogen compounds, macro magneto-resistive materials, and/or organic polymer materials. The resistive memory device also exhibits nonvolatile characteristics.

Figure 2D:
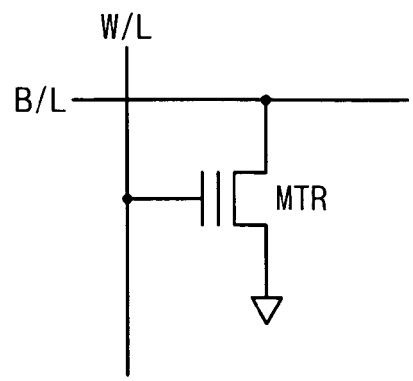

FIG. 2D illustrates an equivalent circuit of a unit memory cell for a nonvolatile memory device that uses a single transistor as the unit memory cell. The unit memory cell includes a single memory transistor MTR. The memory transistor MTR may be formed as a floating-trap type transistor, such as a SONOS (silicon-oxide-nitride-oxide-silicon) structure, or a floating-gate type transistor, such as a flash memory. The control gate of the memory transistor MTR functions as a wordline W/L. The source of the memory transistor MTR is grounded while the drain of the memory transistor MTR is connected to a bitline B/L.

Figure 3:
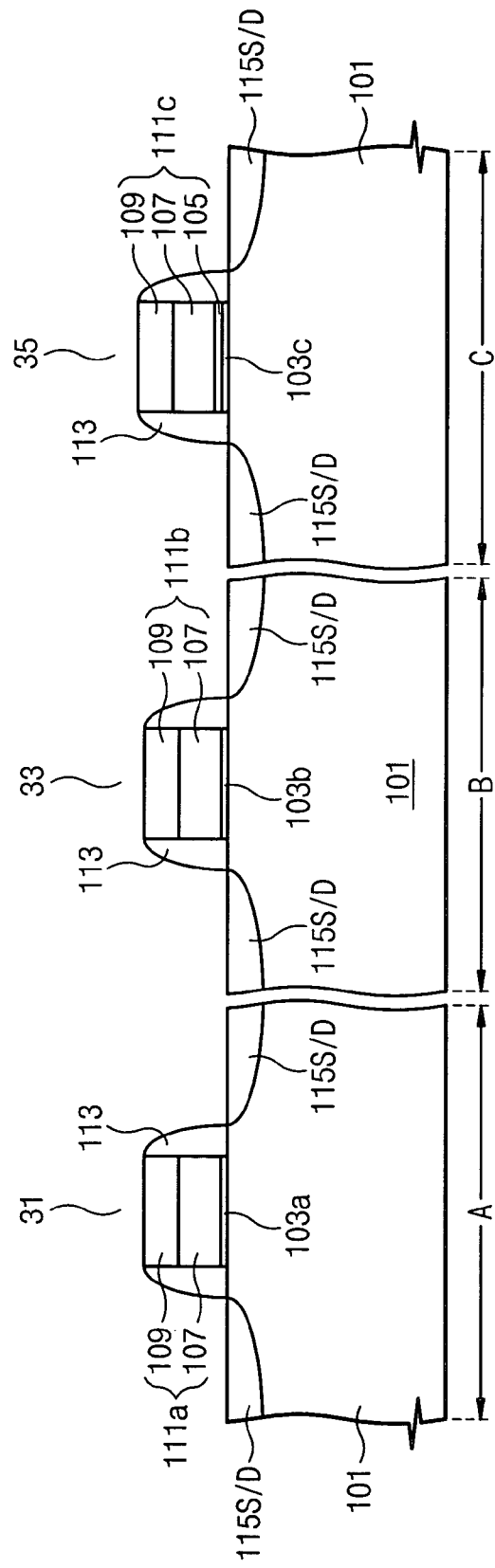
FIG. 3 is a cross-sectional diagram illustrating a semiconductor device in accordance with some embodiments of the invention.
Figure 4:
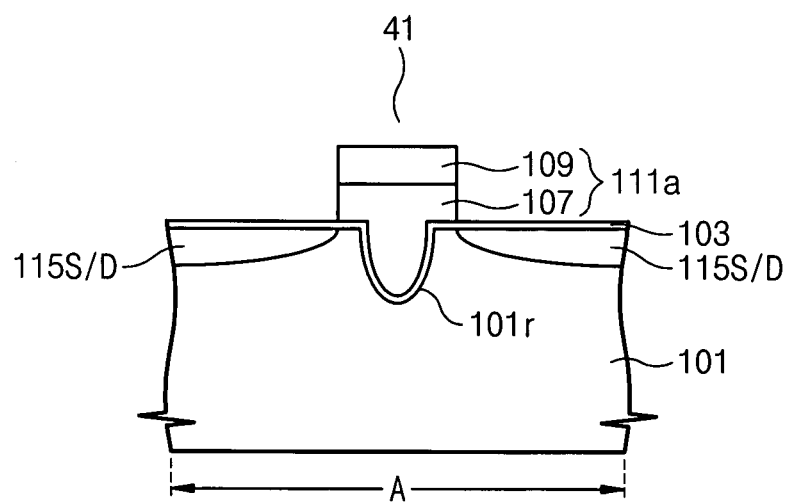
FIGS. 4 and 5 are cross-sectional diagrams illustrating N-type transistors having various gate structures formed in the memory cell region of FIG. 3.
Figure 5:
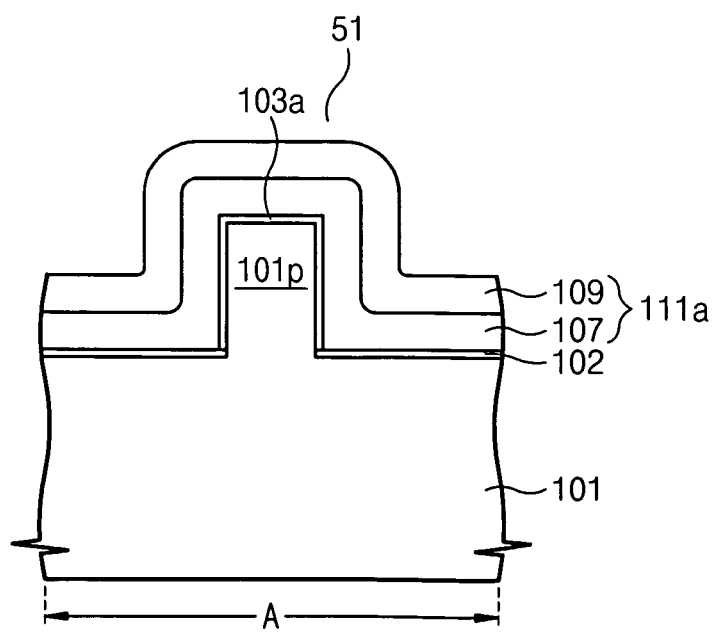

FIGS. 3 through 5 schematically illustrate features of a transistor structure in accordance with some embodiments of the present invention, which may be advantageously applicable to the memory devices introduced with reference to FIGS. 1 and FIGS. 2A through 2D.

In the figures, the reference characters "A," "B," and "C" denote a memory cell region, a region of a peripheral circuit region where an N-type transistor is formed (hereinafter, "peripheral N-type transistor region"), and a region of the peripheral circuit region where a P-type transistor is formed (hereinafter, "peripheral P-type transistor region"), respectively.

When a high-dielectric gate insulation film contacts polycrystalline silicon (hereinafter, "polysilicon"), the Fermi level pinning effect may increase levels of threshold voltages both in P-type and N-type transistors, but with different degrees therebetween. Thus, some embodiments of the present invention may provide a structure of gates for the P-type and N-type transistors using different materials in correspondence with the conditions of the Fermi level pinning effect.

The exemplary gate structure described hereinbelow is relevant to a case in which the Fermi level is pinned around the conduction band of polysilicon when a high-dielectric gate insulation film, such as a hafnium oxide film, contacts polysilicon. If the Fermi level is pinned around the conduction band of polysilicon, an N-type transistor may have a negligible elevation of threshold voltage while a P-type transistor may have a relatively high elevation of threshold voltage as compared to the N-type transistor. Thus, a metal layer may be used for a gate of the P-type transistor instead of polysilicon.

Referring to FIG. 3, the P-type and N-type transistors have different gate materials. Gates of an N-type transistor 31 in the memory cell region 'A' and an N-type transistor 33 in the peripheral N-type transistor region 'B' are formed of the same material. The N-type transistors, 31 and 33, have gates 111a and 111b, respectively, with each gate being formed of a polysilicon film 107 and a low-resistive metal layer 109 that are stacked in sequence on a respective gate insulating films 103a and 103b. A gate 111c of a P-type transistor 35 in the peripheral P-type transistor region 'C' is formed of a metal layer 105, the polysilicon film 107, and the low-resistive metal layer 109 that are stacked in sequence on a gate insulating film 103c. The polysilicon film 107 is doped with N-type impurities.

The metal layer 105 of the gate of the P-type transistor 35 may comprise, but is not limited to, Ta, Ti, Al, Ag, Cu, Hf, Zr, Mn, Ni, Pd, Pt, Be, Ir, Te, Re, Ru, $RuO_2$, TiN, TaN, WN, HfN, HfN, ZrN, TaSiN, TaSiN, NiSi, metal silicide, or a combination thereof. The low-resistive metal layer 109 may comprise tungsten, tungsten nitride, tungsten silicide, or a combination thereof.

Gate insulation films, 103a, 103b, and 103c, of the transistors 31, 33, and 35 may be formed of a high-dielectric material such as silicate, oxy-nitride, binary oxide, and/or ternary oxide. For example, the gate insulation films 103a, 103b, and 103c may comprise, but are not limited to, $HfO_2$, $ZrO_2$, $TiO_2$, $Al_2O_3$, $Ta_2O_5$, $Nb_2O_3$, $La_2O_3$, $Pr_2O_3$, $Ce_2O_3$, $Dy_2O_3$, $Er_2O_3$, $Y_2O_3$ and $ZrSiO_4$, ZrSiON, HfSiO, HfSiON, HfAlO, HfAlON, AlSiO, AlSiON, $BaSiO_4$, $PbSiO_4$, BST, PZT, or a combination thereof.

As an example, the gate insulation film 103a in the memory cell region 'A' may be formed by sequentially stacking a silicon oxide film and a high-dielectric insulation film. Likewise, in the peripheral regions 'B' and 'C,' a transistor in need of being operable with a high threshold voltage may have a gate insulation film where a silicon oxide film and a high-dielectric insulation film are stacked in sequence.

Source/drain regions 115S/D are formed in the substrate at both sides of the gates in which ionic impurities are injected in correspondence with a conductive type of the transistor therein. For instance, P-type impurities are injected into the substrate to form P-type source/drain regions of the P-type transistor 35, while N-type impurities are injected into the substrate to form N-type source/drain regions of the N-type transistors 31 and 33.

Between the substrate 101 and the gates, 111a, 111b, and 111c of the transistors 31, 33, and 35 are interposed the gate insulation films 103a, 103b, and 103c. While polysilicon film 107 contacts the gate insulation films 103a and 103b in the N-type transistors 31 and 33, the metal layer 105 contacts the gate insulation film 103c in the P-type transistor 35.

Because the gate insulation film 103c directly contacts the metal layer 105 in the P-type transistor 35, it may not suffer from boron penetration and gate depletion problems as compared to a conventional P-type transistor in which a polysilicon gate contacts a gate insulation film. And, because a metal with an appropriate work function is used as the gate material, the threshold voltage of the P-type transistor may be regulated.

Meanwhile, in the N-type transistors 31 and 33, the polysilicon layer 107 contacts the gate insulation films 103a and 103b wherever the N-type transistors are located. Here, there may be concern about the Fermi level pinning effect due to a reaction between the polysilicon and gate insulation films, which makes a threshold voltage fixed thereto. But, as the Fermi level is pinned around the conduction band that is positioned higher than a middle gap of the polysilicon, the threshold voltage does not increase very much. Such a small increase in threshold voltage can be compensated by adjusting impurities or dopant concentration. Therefore, although a polysilicon gate is used for the N-type transistor, it is possible to set an optimum threshold voltage for the N-type transistor. Some merits, arising from the feature that the polysilicon layer is used for the gates of the N-type transistors in the memory cell region 'A', will be apparent through the descriptions hereinafter with reference to FIGS. 4 and 5.

The N-type transistor 31 of the memory cell region 'A' and the N-type transistor 33 of the peripheral N-type transistor region 'B' may be formed using the same material. Thus, it is possible to make the threshold voltages of the N-type transistors different from each other by differentiating dopant concentrations during an ion implantation process for adjusting the threshold voltages. Further, it is also possible to differentiate the threshold voltages of the N-type transistors 31 and 33 by forming the gate insulation films different from each other in thickness or in material.

By contrast, because the P-type transistor has a threshold voltage that may vary with large fluctuations, it may be difficult to compensate for the threshold voltage variations just by the dopant control method. Thus, some embodiments of the present invention use the metal layer as a gate for the P-type transistor.

The thicknesses of materials constituting the gate structure will now be described in more detail. As discussed above, as it is enough to accomplish certain features by forming the gates of the N-type transistors using a polysilicon layer while the gate of the P-type transistor is formed using a metal layer, the thicknesses of the films (or layers) forming the gates of the transistors are not limited to specific ranges. But, in some embodiments of the present invention, the metal layer 105 of the P-type transistor 35 may be formed with a small thickness in consideration of manufacturing processes because there may be some difficulties in etching a metal layer. For example, the metal layer 105 of the P-type transistor 35 may be formed to have a thickness of about 100 Å.

While the polysilicon layer 107 is shown as being formed of a single layer in FIG. 3, it may comprise several layers in consideration of manufacturing processes in accordance with some embodiments of the present invention. This will be further described hereinafter with respect to processing steps for the gate structure.

An N-type transistor for a memory cell in the memory cell region 'A' may cause a short-channel effect when manufacturing a high density memory device. Therefore, lessening the short-channel effect therein may be considered with respect to the N-type transistor in the memory cell region 'A'. Thus, the N-type transistor of the memory cell region may be formed in the pattern with a recessed channel as shown in FIG. 4 or with a fin channel as shown in FIG. 5 in accordance with some embodiments of the present invention.

First, referring to FIG. 4, there is a recessed region 101r under a gate 111a of an N-type transistor 41 in the memory cell region 'A,' which acts as a channel region. It may increase an effective channel length of the N-type transistor 41 in the memory cell region 'A,' preventing or reducing the short-channel effect. The recessed channel structure may be advantageous to the N-type transistor 41 using a polysilicon layer as a gate thereof in consideration of manufacturing processes. Although the recessed portion 101r makes a surface of the substrate, where the polysilicon layer is deposited, less flat, it may not cause a problem because the polysilicon has generally excellent step coverage.

There is another way to increase an effective channel length of the N-type transistor, such that a channel region is configured to protrude from the surface of the substrate as shown in FIG. 5. FIG. 5 exemplarily illustrates a cross-sectional view of a fin transistor along the lengthwise direction of the gate.

Referring to FIG. 5, a fin region 101p protruding from the substrate 101 acts as a channel of the N-type transistor. Thus, an effective channel length thereof may increase to prevent or reduce the short-channel effect therein. Further, as mentioned above, although the fin region 101p makes a surface of the substrate where the polysilicon layer is deposited less flat, it may not cause a problem because the polysilicon has generally excellent step coverage. In FIG. 5, the reference numeral 102 denotes a device isolation region.

Methods for manufacturing a semiconductor device, according to some embodiments of the present invention, will be described using the N-type transistor with the recessed channel in the memory cell region 'A' as an example.

FIGS. 6 through 10 are cross-sectional diagrams illustrating methods for fabricating a semiconductor device in accordance with some embodiments of the invention, as a part of a substrate.

Referring to FIG. 6, a device isolation layer is formed in a substrate 201 by way of a typical device isolation process, defining the memory cell region 'A', the peripheral N-type transistor region 'B', and peripheral P-type transistor region 'C'.

A well formation process is carried out to form wells in order to provide different kinds of transistors in the substrate. For instance, if the substrate 201 is a p-type substrate, an N-type well is formed for P-type transistor. Conversely, a P-type well may be formed for an N-type transistor.

To form the recessed channel in the memory cell region 'A,' the substrate 201 at the memory cell region 'A' is partially etched away to form the recessed region 201r. The recessed region 201r may be formed by means of a dry or wet etching process, or the combination thereof in accordance with some embodiments of the present invention.

An insulation film with a high dielectric constant is formed on the overall structure of the substrate for a gate insulation film 203. For example, a hafnium silicon oxide film is deposited thereon to have a thickness of about 40 Å. A metal layer 205 for the gate of the P-type transistor is formed on the gate insulation film 203. The metal layer 205 may be a tantalum oxide film having a thickness of about 100 Å.

Referring to FIG. 6, an etch mask 310 is formed to selectively remove the metal layer 205 except that corresponding to the peripheral P-type transistor region 'C'. In other words, the etch mask 310 covers the peripheral P-type transistor region 'C', but exposes the memory cell region 'A' and the peripheral N-transistor region 'B'. The etch mask 310 is, for example, formed of polysilicon having a thickness of about 300 Å. The etch mask 310 may be made using a material having an etching selectivity with respect to the metal layer 205 thereunder. For example, the etch mask 310 may be formed of a polysilicon layer having a thickness of about 300 Å and an oxide film having a thickness of about 900 Å that are stacked in sequence. In this case, the oxide film is first patterned by means of a photolithography and etching process and thereby an oxide mask is completed. After etching the polysilicon layer disposed by the oxide mask and then forming a polysilicon mask, the oxide mask is removed therefrom. A single layer of the oxide mask or a nitride mask, or the combination thereof may be used. Also, like the embodiments using the polysilicon layer, the metal layer may be used as a part of the gate of the transistor.

Referring to FIG. 7, an etching process is carried out with the etching mask 310 to remove the metal layer 205 from the memory cell region 'A' and the peripheral N-transistor region 'B', leaving a part of the metal layer 205 in the peripheral P-transistor region 'C'. As a result, the gate insulation films 203 are exposed in the memory cell region 'A' and the peripheral N-type transistor region 'B'.

Referring to FIG. 8, in forming the gates of the N-type transistors, an N-type doped polysilicon layer 207 is deposited on the gate insulation film 203a and 203b of the memory cell region 'A' and the peripheral N-type transistor region 'B' and on the polysilicon layer 310 of the peripheral P-type transistor region 'C'. As the polysilicon has generally excellent step coverage, the recessed region 201r can be filled with the polysilicon layer 207 without voids therein. The doped polysilicon layer 207 may be formed by doping simultaneously while depositing polysilicon through an in-situ processing technique or by injecting ionic impurities thereinto after depositing an undoped polysilicon layer.

A low-resistive metal layer 209 is then formed on the doped polysilicon layer 207 to lower the resistance of the gate electrode. The low-resistive metal layer 209 may be made of tungsten, tungsten nitride, tungsten silicide, or a combination thereof in accordance with some embodiments of the present invention. A capping layer 210 is formed on the low-resistive metal layer 209 to protect the gate structure. The capping layer 210 may be made of silicon nitride.

A gate mask 217 is formed on the capping layer 210 to make the gate in a desired pattern. The gate mask 217 may be formed by depositing a photosensitive film, such as photoresist, by means of a spin coating technique, exposing the photoresist film using a prepared reticle, and developing the exposed photoresist film using an appropriate developing solution.

Referring to FIG. 9, an etching process is carried out with the gate mask 217 until the gate insulation film 203 is disclosed, resulting in gates 211a, 211b, and 211c in the memory cell region 'A', the peripheral N-type transistor region 'B', and the peripheral P-type transistor region 'C', respectively. The gate 211a of the memory cell region 'A' and the gate 211b of the peripheral N-type transistor region 'B' are provided for the N-type transistors, each including the doped polysilicon layer 207 and the low-resistive metal layer 109 that are stacked in sequence. The gate 211c of the peripheral P-type transistor region 'C' is provided for the P-type transistor and includes the metal layer 205, the polysilicon layers 310 and 207, and the low-resistive metal layer 109 that are stacked in sequence.

Figure 10:
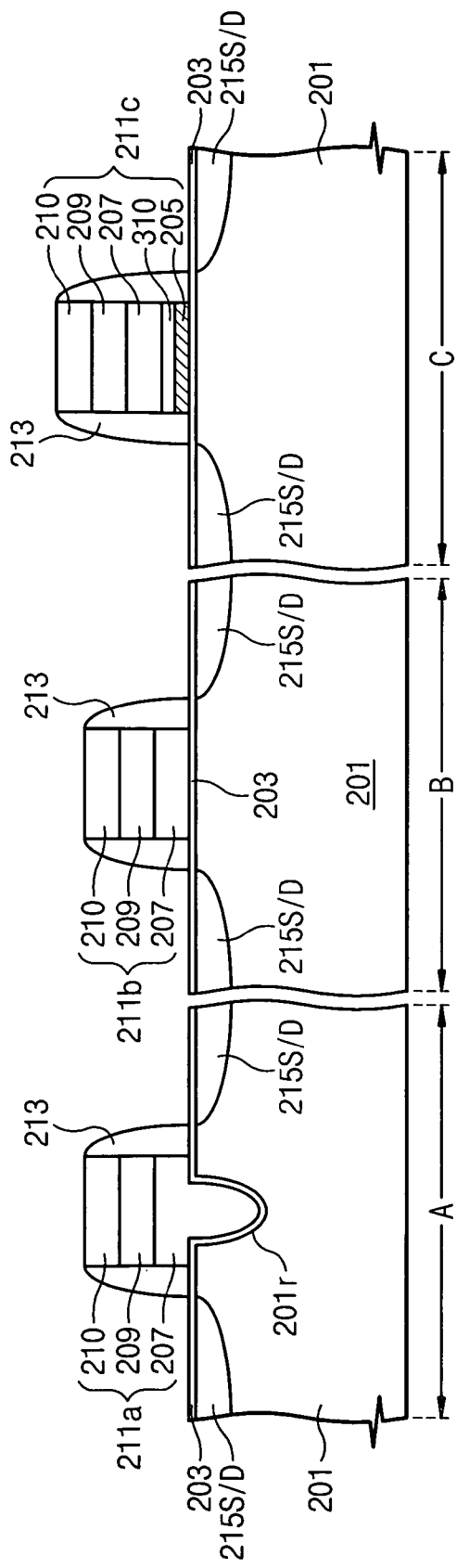

Referring to FIG. 10, after depositing an insulation film on the resultant structure, an etch-back process is carried out to form spacers 213 on sidewalls of the gates 211a, 211b, and 211c. The spacers 213 may be formed, for example, using silicon nitride films. Ion implantation processes are carried out to form source/drain regions 215S/D in the substrate 201 at both sides of the gates. N-type ionic impurities are injected to the source/drain regions of the N-type transistors while P-type ionic impurities are injected to the source/drain regions of the P-type transistor.

Figure 11:
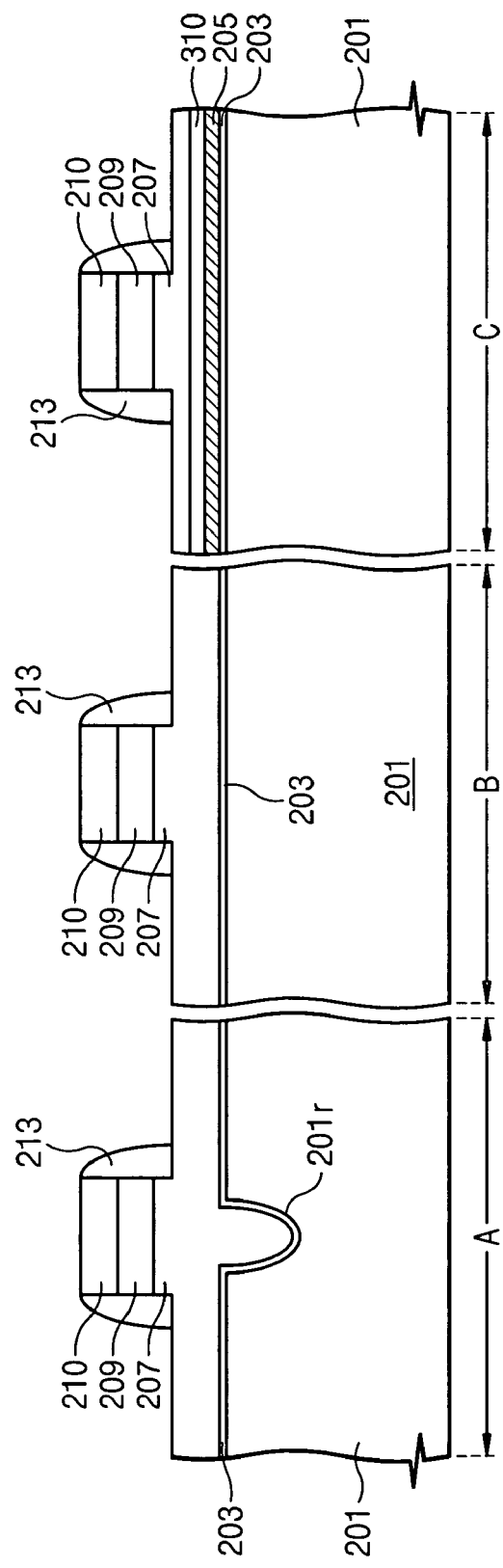
FIGS. 11 through 14 are cross-sectional diagrams illustrating methods for fabricating a semiconductor device in accordance with further embodiments of the invention, as a part of a substrate.

While the spacers 213 are formed after completing the gates 211a through 211c, in other embodiments, the gates 211a may be formed after formation of the spacers 213. This processing feature with modification will be described later with reference to FIGS. 11 through 14. In other words, while the etching process with the gate mask 217 in the former embodiments proceeds until the gate insulation film 203 is exposed, the etching process may also be conducted until the doped polysilicon layer 207 is partially removed as shown in FIG. 11. As a result, in the embodiments shown FIGS. 11 through 14, bottom edges of the gate structures are shaped into step forms. In other words, the bottom sides of the gate structures are configured to be protuberant patterns (i.e., 凸) in a cross-sectional view.

After prosecuting the processing steps described with reference to FIGS. 6 through 8, the low-resistive metal layer 209 and the doped polysilicon layer 207 are partially etched as illustrated by FIG. 11. And, after depositing an insulation film, such as silicon nitride, on the resultant structure, an etch-back process is carried out to form the spacers 213 thereon.

Figure 12:
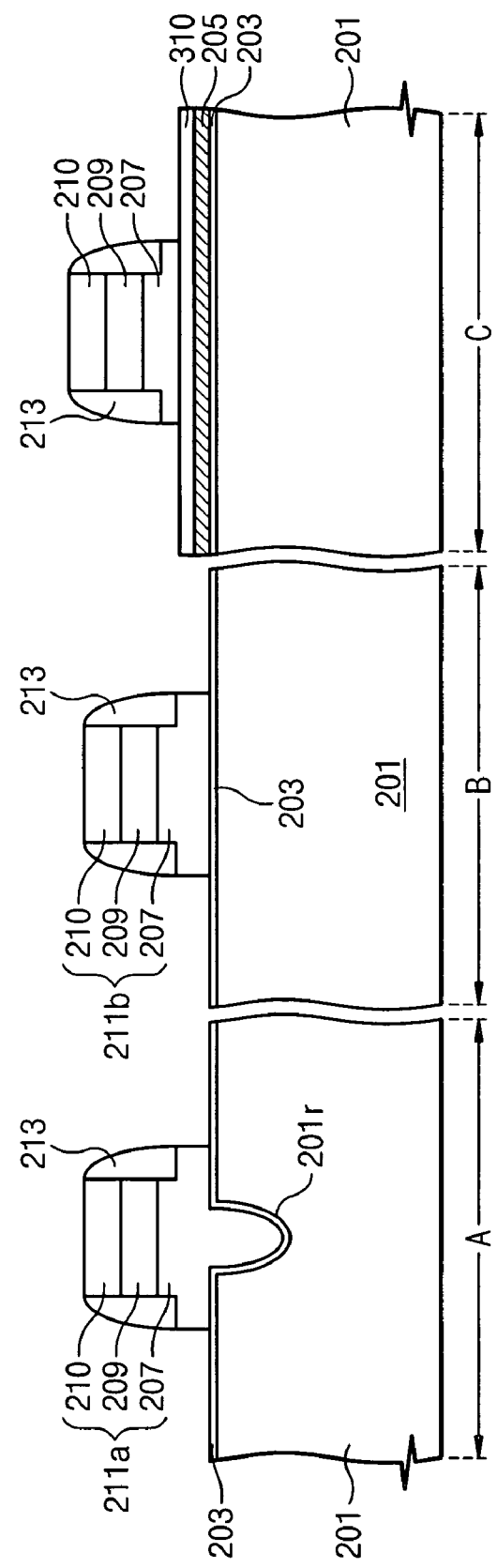

Referring to FIG. 12, the doped polysilicon layer 207 remaining thereon is removed by using the spacers 213 as an etch mask, completing the gates 211a and 211b for the N-type transistors respectively in the memory cell region 'A' and the peripheral N-type transistor region 'B'. Thus, the bottom edges of the gates 211a and 211b in the N-type transistors are configured in the shape of step. Namely, the bottoms of the gates are formed with protuberant patterns (i.e., 凸). While the metal layer 205 and the polysilicon mask layer 310 have remained in the peripheral P-type transistor region 'C', it is possible to remove the polysilicon mask layer 310 in the peripheral circuit region 'C' simultaneously when the doped polysilicon 207 is removed from the memory cell region 'A' and the peripheral N-type transistor region 'B'.

Figure 13:
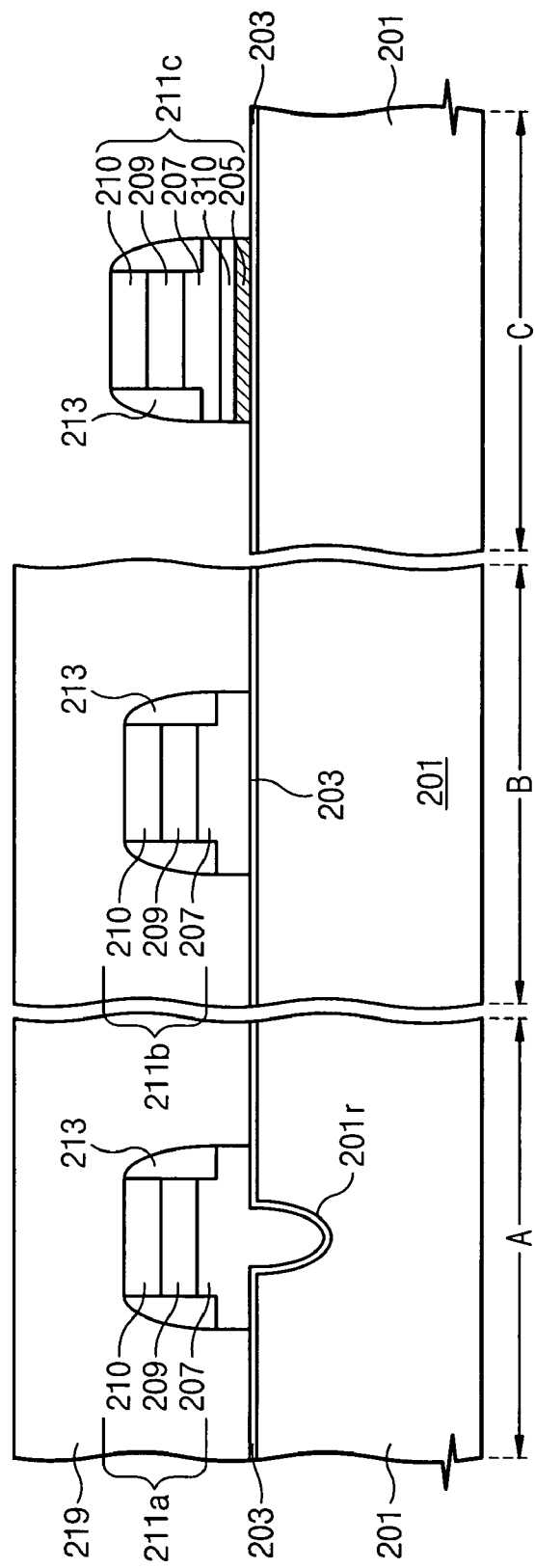

Referring to FIG. 13, to complete the gate structure for the P-type transistor, after depositing a protection film 219 that covers the memory cell region 'A' and the peripheral N-type transistor region 'B', an etching process is carried out using the spacers 213 as an etch mask to remove the polysilicon mask layer 310 and the metal layer 205 that remain in the peripheral P-type transistor region 'C'. Thus, the gate 211c is completed. As a result, the bottom edges of the gate 211c in the P-type transistor are configured in the shape of step. In other words, the bottom of the gate 211c is formed with a protuberant pattern (i.e., 凸).

Figure 14:
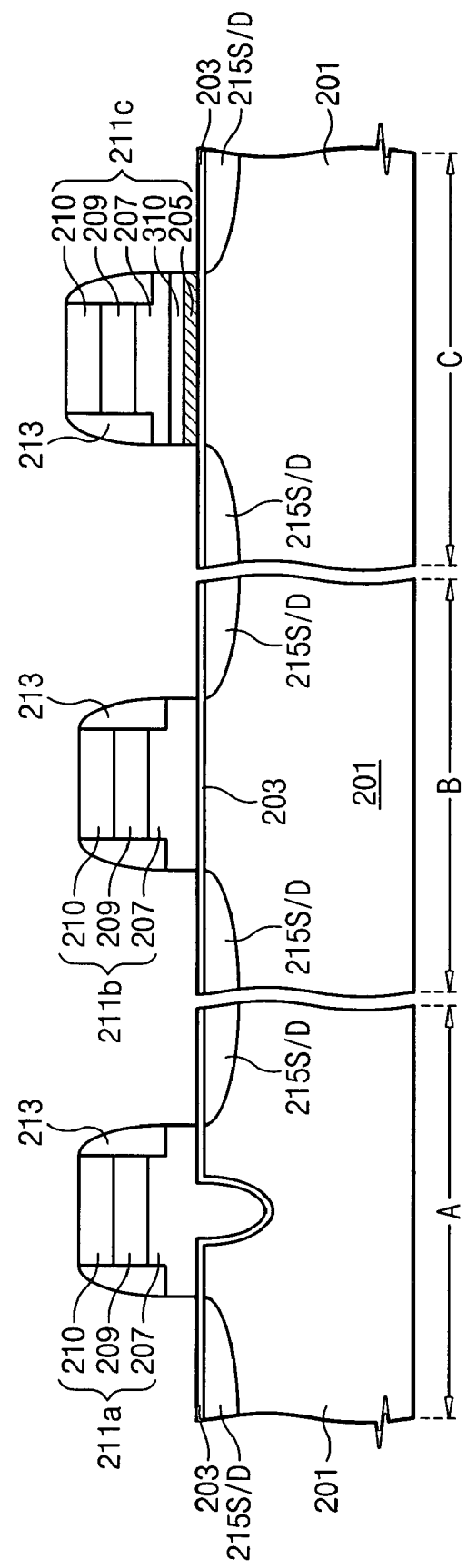

Referring to FIG. 14, similar to the aforementioned processing steps, ion implantation processes are carried out to form the source/drain regions 215S/D in the substrate 201 at the both sides of the gates 211a through 211c.

In addition, hereinafter processing steps for fabricating the semiconductor device in accordance with still further embodiments of the invention, will be described with reference to FIGS. 15 through 18.

Referring to FIG. 15, region isolation films (not shown) are formed on a substrate 201 by way of a typical device isolation process defining the memory cell region 'A,' the peripheral N-type transistor region 'B,' and peripheral P-type transistor region 'C.'

Well formation processing operations are carried out to form wells to provide different kinds of transistors in the substrate. For instance, if the substrate 201 is a p-type substrate, an N-type well is formed for a P-type transistor. Further, a P-type well may be formed for an N-type transistor.

To form the recessed channel in the memory cell region 'A', the substrate 201 at the memory cell region 'A' is partially etched away to form the recessed region 201r. The recessed region 201r may be formed by means of a dry or wet etching process, or the combination thereof, in accordance with some embodiments of the present invention.

An insulation film with a high dielectric constant is formed on the overall structure of the substrate as a gate insulation film 203. For example, a hafnium silicon oxide film is deposited thereon having a thickness of about 40 Å. A first polysilicon layer 310 for the gates of the N-type transistors, in which N-type impurities are doped, is formed on the gate insulation film 203 having a thickness of about 300 Å. The first polysilicon layer 310 has generally excellent step coverage to fill the recessed region 201r without voids.

On the first polysilicon layer 310, an etch mask 217 is formed to expose the peripheral P-type transistor region 'C' but cover the memory cell region 'A' and the peripheral N-type transistor region 'B'. The etch mask 217 may be formed of silicon oxide, silicon nitride, or a combination thereof, in accordance with some embodiments of the present invention.

An etching process is carried out using the etch mask 217 to remove the first polysilicon layer 310 from the peripheral P-type transistor region 'C'. Accordingly, the gate insulation film 203 is exposed in the peripheral P-type transistor region 'C'. After removing the etch mask 217, the metal layer 205 is deposited on the gate insulation film 203 in the peripheral P-type transistor region 'C' and on the first polysilicon layer 310 in the cell array region 'A' and the peripheral N-type transistor region 'B'.

Referring to FIG. 17, the metal layer 205 is selectively removed from the memory cell region 'A' and the peripheral N-type transistor region 'B,' but remains in the peripheral P-type transistor region 'C'. The metal layer 205 may be selectively removed from the memory cell region 'A' and the peripheral N-type transistor region 'B' by way of a photolithography and etching process. When a silicon oxide film is used as the etch mask 217, the silicon oxide film etch mask 217 can be removed after selectively removing the first polysilicon 310 from the cell array region 'A' and peripheral N-type transistor region 'B' by using the silicon oxide film etch mask 217 as an etch stop.

Referring to FIG. 17, a second polysilicon layer 207 is deposited on the metal layer 205 and the first polysilicon layer 310 having a thickness of about 800 Å. The low-resistive metal layer 209 and the capping layer 210 are then formed in sequence on the second polysilicon layer 207.

Figure 18:
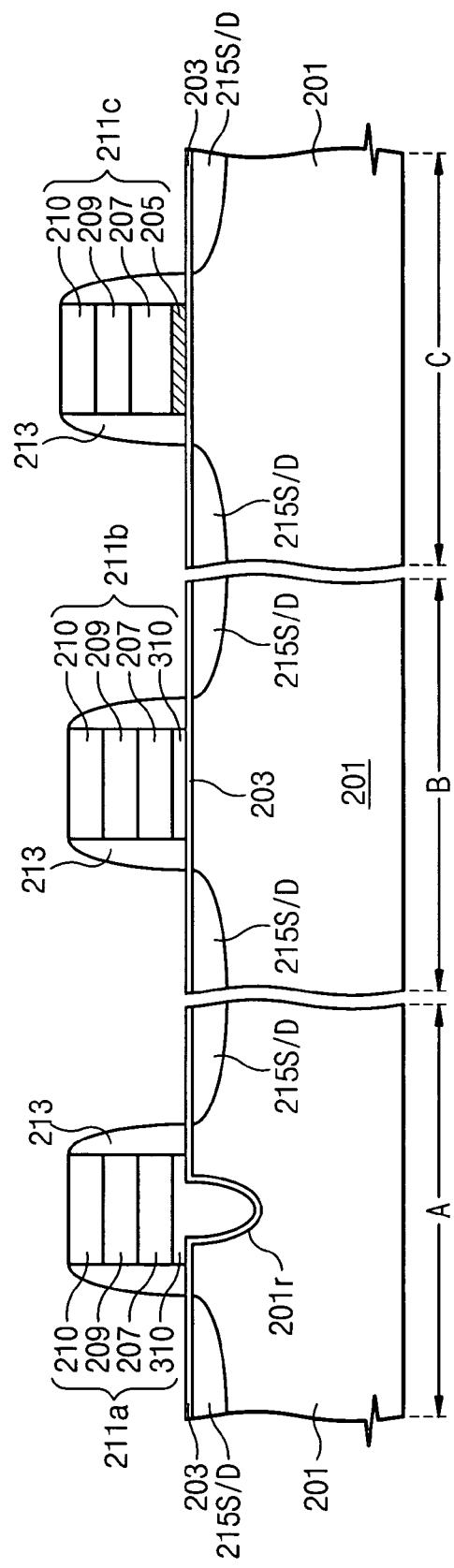

Referring to FIG. 18, similar to the embodiments discussed above, a photolithography and etching process is carried out to complete the structures of the gates 211a~211c and then the spacers 213 are formed on the sidewalls of the gates 211a~211c. Ion implantation processes are then conducted to form the source/drain regions 215S/D.

According to some embodiments, the gates 211a and 211b of the N-type transistors include the polysilicon layers 310 and 207 and the low-resistive metal layer 209 that are stacked in sequence. The gate 211c of the P-type transistor includes the metal layer 205, the polysilicon layer 207, and the low-resistive metal layer 209 that are stacked in sequence.

As described above, the gates of N-type transistors corresponding to the memory cell and peripheral regions are formed of polysilicon while the gate of the P-type transistor corresponding to the peripheral region is formed of metal. As a result, a threshold voltage may be set lower by using the metal layer for the P-type transistor, which may reduce or prevent the problems of boron penetration and gate depletion. The threshold voltage of an N-type transistor may be controlled to be lower by properly adjusting dopant concentration in consideration of a high-density memory device.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A semiconductor device, comprising:
   a first N-type transistor formed in a first region of a substrate; and
   a second N-type transistor and a P-type transistor in a second region of the substrate;
   wherein gates of the first and second N-type transistors and the P-type transistor are isolated from the substrate through respective gate insulation films; and
   wherein the gates of the first and second N-type transistors comprise respective polysilicon layers and the gate of the P-type transistor comprises a metal layer that contact the respective gate insulation films and the gate of the P-type transistor comprises the metal layer and a second polysilicon layer that are stacked in sequence.

2. The semconductor device of claim 1, wherein each of the gates of the first and second N-type transistors comprises the polysilicon layer and a second metal layer that are staked in sequence on the gate insulation film;
   wherein the gate of the P-type transistor comprises the metal layer, the second polysilicon layer, and a third metal layer that are stacked in sequence on the gate insulation film.

3. The semiconductor device of claim 1, wherein the gate insulation films for the transistors comprise $HfO_2$, $ZrO_2$, $TiO_2$, $Al_2O_3$, $Ta_2O_5$, $Nb_2O_3$, $La_2O_3$, $Pr_2O_3$, $Ce_2O_3$, $Dy_2O_3$, $Er_2O_3$, $Y_2O_3$ and $ZrSiO_4$, ZrSiON, HfSiO, HfSiON, HfAlO, HfAlON, AlSiO, AlSiON, $BaSiO_4$, $PbSiO_4$, BST, and/or PZT.

4. The semiconductor device of claim 1, wherein the metal layer of the gate of the P-type transistor comprises Ta, Ti, Al, Ag, Cu, Hf, Zr, N/In, Ni, Pd, Pt, Be, lr, Te, Re, Ru, $RuO_2$, TiN, TaN, WN, HfN, HN, ZrN, TaSiN, TaSiN, NiSi, and/or metal silicide.

5. The semiconductor device of claim 2, wherein the third metal layer stacked on the second polysilicon layer comprises tungsten, tungsten nitride, and/or tungsten silicide.

6. The semiconductor device of claim 1, wherein the gate insulation film of the first N-type transistor comprises a silicon oxide film and a high-dielectric film that has a higher dielectric constant than the silicon oxide film;
   wherein the gate insulation films of the second N-type transistor and the P-type transistor comprise the high-dielectric film.

7. The semiconductor device of claim 1, further comprisina:
   a memory element with a terminal connected to a first impurity junction of the first N-type transistor;
   a ground line connected to a second impurity junction of the first N-type transistor; and
   a bitline connected to another terminal of the memory element;
   wherein the gate of the first N-type transistor acts as a wordline.

8. The semiconductor device of claim 3, further comprising:
   a memory element with a terminal connected to a first impurity junction of the first N-type transistor;
   a ground line connected to a second impurity junction of the first N-type transistor; and
   a bitline connected to another terminal of the memory element,
   wherein the gate of the first N-type transistor is a wordline that is operative to select the memory element.

9. The semiconductor device of claim 1, wherein the first N-type transistor comprises a recessed channel under the gate.

10. The semiconductor device of claim 1, wherein the first region is a memory cell region comprising a plurality of memory elements and the second region is a peripheral circuit region where logical circuits are configured to control the memory cell region.

11. A semiconductor device comprising:
- a first transistor having a first conductivity formed in a memory cell region of a substrate; and
- a second transistor having the first conductivity and a third transistor having a second conductivity in a peripheral circuit region of the substrate;
- wherein gates of the first and second transistors with the first conductivity, and the third transistor with the second conductivity each comprise a silicon layer that is stacked over the substrate through a high-dielectric gate insulation film and contains impurities of a respective conductivity type:
- wherein the gate of the third transistor with the second conductivity comprises a metal layer and a second silicon layer that are stacked in sequence between the silicon layer and the high-dielectric gate insulation film.

12. The semiconductor device of claim 11, wherein the high-dielectric gate insulation film comprises $HfO_2$, $ZrO_2$, $TiO_2$, $Al_2O_3$, $Ta_2O_5$, $Nb_2O_3$, $La_2O_3$, $Pr_2O_3$, $Ce_2O_3$, $Dy_2O_3$, $Er_2O_3$, $Y_2O_3$ and $ZrSiO_4$, ZrSiON, HfSiO, HfSiON, HfAlO, HfAlON, AlSiO, AlSiON, $BaSiO_4$, $PbSiO_4$, BST, and/or PZT.

13. The semiconductor device of claim 12, wherein the metal layer comprises Ta, Ti, Al, Ag, Cu, Hf, Zr Mn Ni, Pd, Pt, Be, Ir, Te, Re, Ru, $RuO_2$, TiN, TaN, WN, HfN, HfN, ZrN, TaSiN, TaSiN, NiSi, and/or metal silicide.

14. A semiconductor device, comprising:
- a first gate for an N-type transistor and a second gate for a P-type transistor on a substrate with a gate insulating film;
- wherein one of the gates is a polysilicon layer while the other of the gates is a metal layer;
- wherein the second gate is formed of the metal layer when a Fermi level is pinned around a conduction band of the polysiicon layer due to contact between the gate insulating film and the polysilicon layer; and
- wherein the first gate is formed of the metal layer when the Fermi level is pinned around a valence band of the polysiicon layer.

* * * * *